(12) United States Patent
Noguchi et al.

(10) Patent No.: US 7,105,226 B2
(45) Date of Patent: Sep. 12, 2006

(54) PRESSURE SENSITIVE ADHESIVE DOUBLE COATED SHEET AND METHOD OF USE THEREOF

(75) Inventors: Hayato Noguchi, Agatsuma-machi (JP); Yoshihisa Mineura, Agatsuma-machi (JP); Kazuyosi Ebe, Shiraoka-machi (JP); Katsuhiko Horigome, Saitama (JP)

(73) Assignee: Lintec Corporation, Tokyo (JP)

( * ) Notice: Subject to any disclaimer, the term of this patent is extended or adjusted under 35 U.S.C. 154(b) by 288 days.

(21) Appl. No.: 10/140,355

(22) Filed: May 6, 2002

(65) Prior Publication Data

US 2003/0029544 A1 Feb. 13, 2003

Related U.S. Application Data

(63) Continuation-in-part of application No. 09/382,965, filed on Aug. 25, 1999, now Pat. No. 6,398,892.

(51) Int. Cl.
*C09J 7/02* (2006.01)

(52) U.S. Cl. ............... 428/354; 428/345; 428/343; 428/355 AC (58) Field of Classification Search .............. 428/354, 428/345, 343, 355 AC See application file for complete search history.

(56) References Cited

U.S. PATENT DOCUMENTS

| | | | |
|---|---|---|---|
| 4,729,971 A | 3/1988 | Coleman | |
| 4,853,286 A * | 8/1989 | Narimatsu et al. | 428/343 |
| 4,965,127 A | 10/1990 | Ebe et al. | |
| 5,476,566 A | 12/1995 | Cavasin | |
| 5,534,102 A | 7/1996 | Kadono et al. | |
| 5,714,029 A | 2/1998 | Uemura et al. | |
| 5,976,691 A * | 11/1999 | Noguchi et al. | 428/354 |
| 6,176,966 B1 | 1/2001 | Tsujimoto et al. | |
| 6,225,194 B1 * | 5/2001 | Noguchi et al. | 438/464 |
| 6,398,892 B1 * | 6/2002 | Noguchi et al. | 156/85 |

FOREIGN PATENT DOCUMENTS

| | | |
|---|---|---|
| EP | 0 157 508 A2 | 3/1985 |
| JP | 60-196956 A | 10/1985 |
| JP | 60-223139 A | 11/1985 |
| JP | 64-64772 A | 3/1989 |
| JP | 1-104682 A | 4/1989 |
| JP | 4-233249 A | 8/1992 |
| JP | 5-32946 A | 2/1993 |
| JP | 7-18231 A | 1/1995 |
| JP | 7-62304 A | 3/1995 |
| JP | 8-27239 A | 1/1996 |

(Continued)

*Primary Examiner*—Daniel Zirker
(74) *Attorney, Agent, or Firm*—The Webb Law Firm (57) ABSTRACT

Disclosed herein is a pressure sensitive adhesive double coated sheet comprising a shrink substrate and, superimposed on one side thereof, an energy radiation curable pressure sensitive adhesive layer and, superimposed on the other side thereof, a removable pressure sensitive adhesive layer composed of an adhesive having a modulus of elasticity at 120° C. of $5 \times 10^5$ Pa or less.

The pressure sensitive adhesive double coated sheet according to the invention enables efficiently processing a work piece with high precision. In particular the pressure sensitive adhesive double coated sheet is suitable to a process capable of producing IC chips of high thickness precision with high yield by reducing warp and minimizing carrying breakage in the grinding of extremely thin or large diameter silicon wafers and capable of performing back grinding and dicing in the same configuration. Further, the invention provides a process of producing semiconductors of high reliability in which the above pressure sensitive adhesive double coated sheet is used.

4 Claims, 3 Drawing Sheets

FOREIGN PATENT DOCUMENTS

| | | |
|---|---|---|
| JP | 8-316177 A | 11/1996 |
| JP | 10-150007 A | 2/1998 |
| JP | 10-233373 A | 9/1998 |
| JP | 10-284446 A | 10/1998 |

* cited by examiner

PRESSURE SENSITIVE ADHESIVE DOUBLE COATED SHEET AND METHOD OF USE THEREOF

This application is a continuation-in-part of U.S. application Ser. No. 09/382,965, filed Aug. 25, 1999, now U.S. Pat. No. 6,398,892, the contents of which are incorporated by reference herein.

FIELD OF THE INVENTION

The present invention relates to a pressure sensitive adhesive double coated sheet. More particularly, the present invention relates to a pressure sensitive adhesive double coated sheet for use in processing or protecting a brittle work piece temporarily held on a hard plate.

BACKGROUND OF THE INVENTION

In recent years, the spread of IC cards is being promoted, and accordingly the reduction of the thickness thereof is demanded. Thus, it is now needed to reduce the thickness of semiconductor chips from the conventional about 350 µm to 50–100 µm or less.

It is common practice to grind a wafer back after the formation of a circuit pattern on a wafer surface. The grinding of the wafer back is performed while a pressure sensitive adhesive sheet is stuck to the circuit surface to thereby protect the circuit surface and fix the wafer. Pressure sensitive adhesive sheets comprising a soft substrate coated with a pressure sensitive adhesive are commonly employed in this use. However, in these pressure sensitive adhesive sheets based on a soft substrate, the tension applied at the adhesion is stored as a residual stress. When the wafer has a large diameter or is ground to an extremely small thickness, the residual stress of the pressure sensitive adhesive sheet surpasses the strength of the wafer with the result that the wafer is warped by the force exerted to cancel the residual stress. Further, after the grinding, the brittleness of the wafer, when supported by a soft substrate, has caused wafer breakage during the carrying of the wafer. Therefore, a method comprising fixing the wafer on a hard material such as a quartz plate or an acrylic plate and grinding the wafer is being studied.

In order to cut a hard brittle material such as a printer head, a glass/epoxy substrate, a glass or a ceramic into small chips, the cutting is performed after fixing the hard brittle material on a hard support material. Pressure sensitive adhesive double coated sheets are used for fixing such a cut piece on a hard support material. However, it is extremely difficult to separate the two hard materials mutually stuck with the conventional pressure sensitive adhesive double coated sheet from each other. When a very brittle material such as a wafer is used, it has been unfeasible to be free from damaging thereof.

Therefore, there is a demand for the development of a pressure sensitive adhesive double coated sheet suitable for fixing any of semiconductor wafers and the above-mentioned various cut pieces on a hard material.

Moreover, in the processing of semiconductor wafers, a surface protective sheet and a pressure sensitive adhesive sheet for fixing a wafer are required during the back grinding and the dicing, respectively. This has been burdensome from the viewpoint of process control. Further, the brittleness of the wafer has caused wafer breakage during the carrying of the wafer between the above process steps.

Therefore, there is also a demand for the development of a process enabling performing a sequence of process steps including the above wafer back grinding, dicing and carrying in the same configuration, enabling facilitating process control and enabling preventing wafer breakage.

The present invention has been made in view of the above state of the prior art. The present invention provides a pressure sensitive adhesive double coated sheet which enables efficiently processing a work piece with high precision, in particular a pressure sensitive adhesive double coated sheet suitable to a process capable of producing IC chips of high thickness precision with high yield by reducing warpage and minimizing carrying breakage in the grinding of extremely thin or large diameter silicon wafers and capable of performing back grinding and dicing in the same configuration. In addition, the present invention provides a process of producing semiconductors of high reliability in which use is made of the above pressure sensitive adhesive double coated sheet.

SUMMARY OF THE INVENTION

The pressure sensitive adhesive double coated sheet of the present invention comprises a shrink substrate and, superimposed on one side thereof, an energy radiation curable pressure sensitive adhesive layer, and superimposed on the other side thereof, a removable pressure sensitive adhesive layer comprising a pressure sensitive adhesive having a modulus of elasticity at 120° C. of $5 \times 10^5$ Pa or less.

In the present invention, it is preferred that the adhesive strength on the side of the removable pressure sensitive adhesive layer be 5000 mN/25 mm or less and the shear adhesion thereof be 50000 sec or more. Further, it is preferred that the shrink substrate be furnished with a multiplicity of minute cuts. The pressure sensitive adhesive double coated sheet of the present invention is preferably used to fix or protect a work piece during processing of the work piece temporarily held on a hard plate.

That is, the pressure sensitive adhesive double coated sheet of the present invention is preferably used in a process comprising the sequence of steps of:

sticking a work piece to be processed to energy radiation curable pressure sensitive adhesive layer of the above pressure sensitive adhesive double coated sheet while sticking the removable pressure sensitive adhesive layer to a hard plate so that the work piece is held on the hard plate;

processing the work piece;

irradiating the energy radiation curable pressure sensitive adhesive layer with energy radiation to cure the same while shrinking the shrink substrate; and peeling the processed work piece from the energy radiation curable pressure sensitive adhesive layer having been irradiated and cured.

In the above method of use as well, it is preferred that the shrink substrate be furnished with a multiplicity of minute cuts.

In the above method of use, it is preferred that the work piece is a semiconductor wafer having its surface furnished with a circuit pattern, and that the processing being the grinding of the back of the wafer.

The work piece may be a semiconductor wafer having its surface furnished with a circuit pattern, and the processing may be dicing of the wafer into element chips.

Further, the work piece may be a semiconductor wafer having its surface furnished with a circuit pattern, and the processing may be grinding of the back of the wafer and dicing of the wafer into element chips, and these may be performed in arbitrary sequence.

The above pressure sensitive adhesive double coated sheet of the present invention enables temporarily holding various work pieces on a hard plate to thereby effect the fixing and protection thereof during processing. Also, the pressure sensitive adhesive double coated sheet of the present invention enables easily peeling the work pieces from the sheet by simple operation after the performing of desired processing and protection. Therefore, even if the pressure sensitive adhesive double coated sheet is used in the grinding of the back of, for example, an extremely thin or large-diameter semiconductor wafer, the wafer thickness precision can be enhanced and the warp of the wafer can be reduced thereby. Further, the breakage during wafer carrying can be prevented. Consequently, the pressure sensitive adhesive double coated sheet of the present invention enables production of various electronic components and semiconductor chips with high yield.

Moreover, a sequence of steps including processing and carrying can be performed in the same wafer configuration in the present invention, so that the process control can be facilitated.

DETAILED DESCRIPTION OF THE INVENTION

The present invention will be described in detail below with reference to the appended drawings.

Figure 1:
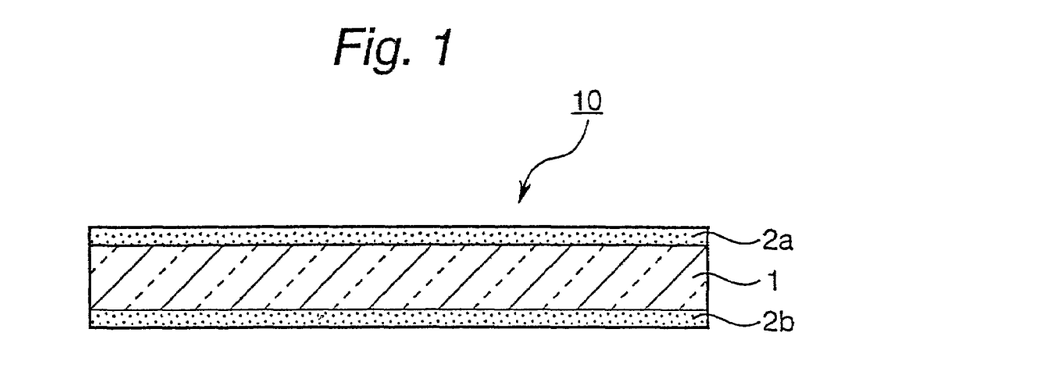
FIG. 1 is a sectional view of the pressure sensitive adhesive double coated sheet of the present invention.

Referring now to FIG. 1, the pressure sensitive adhesive double coated sheet 10 of the present invention comprises a shrink substrate 1 and, superimposed on one side thereof, an energy radiation curable pressure sensitive adhesive layer 2a, and superimposed on the other side thereof, a removable pressure sensitive adhesive layer 2b comprising a pressure sensitive adhesive having a modulus of elasticity at 120° C. of 5×10⁵ Pa or less.

Although the shrink substrate 1 is not particularly limited, preferred is a heat shrink film.

The shrinkage ratio of the shrink film for use in the present invention is preferably in the range of 10 to 90%, still preferably 20 to 80%.

The shrinkage ratio (SR) of the shrink film is calculated from the dimension before shrinkage and the dimension after shrinkage by the formula (Dim.=dimension):

$$SR = \frac{(Dim.\ before\ shrink) - (Dim.\ after\ shrink)}{(Dim.\ before\ shrink)} \times 100$$

When the heat shrink film is used, the above shrinkage ratio values are those calculated from the dimensions of film measured before and after heating at 120° C.

A variety of shrink films is known. Any of various shrink films can generally be used in the present invention as long as any adverse effects such as ionic contamination are not exerted on the work piece. Examples of suitable shrink films include uni-axially or bi-axially oriented films of polyethylene terephthalate, polyethylene, polystyrene, polypropylene, nylon, polyurethane, polyvinylidene chloride, polyvinyl chloride and the like.

The thickness of the above shrink film is generally in the range of 5 to 300 μm, preferably 10 to 200 μm.

Especially a heat shrink film of polyethylene, polypropylene, polyethylene terephthalate or the like is preferably used as the shrink film.

Figure 5:
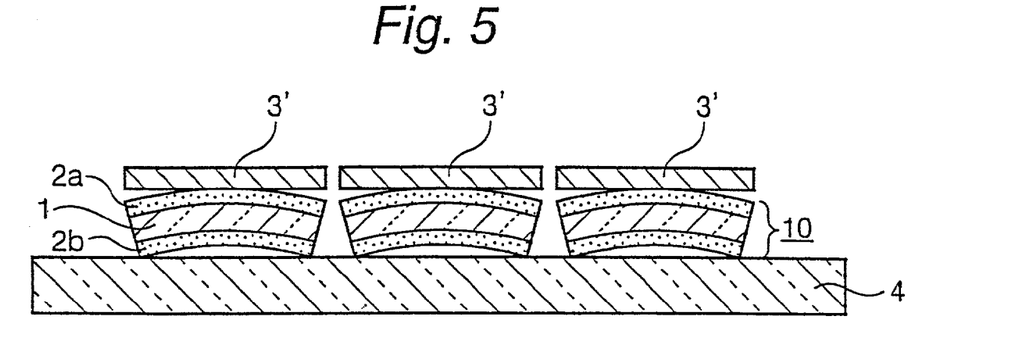
FIG. 5 is a view showing the state of composite after irradiation with energy radiation and after substrate shrinkage.
Figure 10:
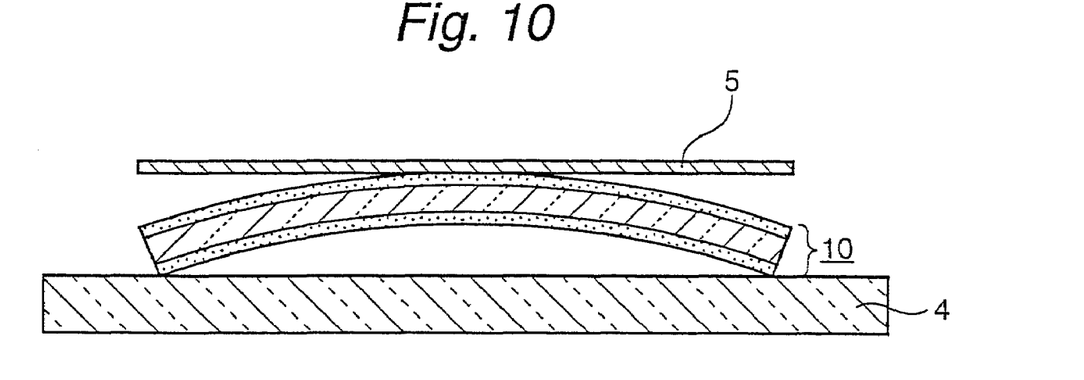
FIG. 10 is a view showing the state of composite after irradiation with energy radiation and after substrate shrinkage.

The shrink film may be a mono-layer of any of the above various shrink films or a laminate of shrink films selected from among those listed above. When the shrink film is a laminate, it is preferred that the laminate be composed of films whose shrinkage ratios are different from each other. When the laminate composed of films whose shrinkage ratios are different from each other is used as the shrink substrate 1, a protrudent transformation is likely to occur toward a lower shrinkage ratio side as shown in FIGS. 5 and 10, so that the sticking of the work piece is only made by point contacts to thereby greatly facilitate the peeling of the work piece.

The shrink film for use as the shrink substrate 1 may be furnished with a multiplicity of minute cuts.

The cut intervals (cutting pitches) are determined depending on the size of each work piece. The cuts are provided at pitches of preferably 0.01 to 2 times and still preferably 0.1 to 1 time the maximum length of bottom face of the work piece. It is generally preferred that the cutting pitches be in the range of 0.1 to 20 mm, especially 1 to 10 mm.

The cut configuration is not particularly limited. For example, the cut pattern may be any of grating, concentric circle and radial forms or a combination thereof. Also, the cuts may have any random configuration. The cuts may be provided over an entire surface of the shrink substrate 1.

In the use of the pressure sensitive adhesive double coated sheet 10 of the present invention, as described later, the energy radiation curable pressure sensitive adhesive layer is irradiated with energy radiation after appropriate steps. When ultraviolet light is used as the energy radiation, all the films constituting the shrink substrate 1 should be permeable for ultraviolet light.

The pressure sensitive adhesive double coated sheet 10 of the present invention comprises the above shrink substrate 1and, superimposed on one side thereof, the energy radiation curable pressure sensitive adhesive 2a.

The energy radiation curable pressure sensitive adhesive generally contains an acrylic pressure sensitive adhesive and an energy radiation polymerizable compound as main components.

For example, low-molecular-weight compounds having in the molecule thereof at least two photopolymerizable carbon to carbon double bonds that can be converted into a three-dimensional network structure by light irradiation as disclosed in Japanese Patent Application Laid-open Publication Nos. 60(1985)-196,956 and 60(1985)-223,139 are widely used as the energy radiation polymerizable compounds to be incorporated in the energy radiation curable pressure sensitive adhesives. Specific examples thereof include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butyleneglycoldiacrylate, 1,6-hexanedioldiacrylate, polyethylene glycol diacrylate and commercially available oligoester acrylates.

Furthermore, besides the above acrylate-based compounds, urethane acrylate-based oligomers can be used as the energy radiation polymerizable compounds. Urethane acrylate oligomers can be obtained by reacting an isocyanate terminated urethane prepolymer which is obtained by coating a polyol compound such as a polyester or polyether compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate with (meth)acrylic ester having a hydroxyl group, such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate.

With respect to the blending ratio of energy radiation polymerizable compound to acrylic pressure sensitive adhesive in the energy radiation curable pressure sensitive adhesive, it is preferred that 50 to 200 parts by weight of the energy radiation polymerizable compound be used per 100 parts by weight of the acrylic pressure sensitive adhesive. In this instance, the initial adhesive strength of the obtained pressure sensitive adhesive sheet is large, and the adhesive strength is sharply dropped upon irradiation of the pressure sensitive adhesive layer with energy radiation. Accordingly, the peeling at the interface of the processed work piece and the acrylic energy radiation curable pressure sensitive adhesive layer is eased to thereby enable picking up of the processed work piece.

The energy radiation curable pressure sensitive adhesive layer 2a may be composed of an energy radiation curable copolymer having an energy radiation polymerizable group as a side chain. This energy radiation curable copolymer exhibits satisfactory adherence and energy radiation curability properties. Details of the energy radiation curable copolymer having an energy radiation polymerizable group as a side chain are described in, for example, Japanese Patent Application Laid-open Publication Nos. 5(1993)-32,946 and 8(1996)-27,239.

The above acrylic energy radiation curable pressure sensitive adhesive possesses satisfactory adhesive strength to the work piece before irradiation with energy radiation, and the adhesive strength is extremely decreased upon irradiation with energy radiation. That is, the work piece can be secured by satisfactory adhesive strength before irradiation with energy radiation, but, after irradiation with energy radiation, the resultant workpiece can be easily peeled.

The other pressure sensitive adhesive layer 2b, namely the removable pressure sensitive adhesive layer provided on the side stuck to a hard plate, is composed of the removable pressure sensitive adhesive layer comprising a pressure sensitive adhesive having a modulus of elasticity at 120° C. of $5 \times 10^5$ Pa or less.

When the modulus of elasticity at 120° C. of the removable pressure sensitive adhesive layer 2b is in the above range, the fluidity of the pressure sensitive adhesive layer 2b is enhanced in the step of shrinking the substrate 1 with heating and thereby the transformation of the energy radiation curable adhesive layer 2a caused by shrinkage of the substrate 1 is not prohibited. Accordingly, the surface transformation of the energy radiation curable adhesive layer 2a caused by the shrinkage of the substrate 1 becomes sufficient so that the contact with the work piece is made by point contact to facilitate the peeling of the work piece. On the other hand, when the modulus of elasticity at 120° C. of the removable pressure sensitive adhesive layer 2b is over the above range, the removable pressure sensitive adhesive layer 2b hardly flows even if heating. Accordingly, the transformation of the energy radiation curable adhesive layer 2a, caused by the shrinkage of the substrate 1 is insufficient so that the contact with the work piece is made by surface contact to become difficult of peeling the work piece.

When the pressure sensitive adhesive is endowed with removability, the pressure sensitive adhesive has high cohesiveness so that usually, it has a modulus of elasticity at 120° C. of $10^6$ Pa or more. Further, the energy radiation curable pressure sensitive adhesive after curing has a higher modulus of elasticity of $10^7$ Pa or more.

Contrary to the above, in the present invention, the removable pressure sensitive adhesive layer 2b has a modulus of elasticity at 120° C. of $5 \times 10^5$ Pa or less, preferably from $5 \times 10^4$ Pa to $3 \times 10^5$ Pa.

Further, the removable pressure sensitive adhesive layer 2b has an adhesive strength of preferably 5000 mN/25 mm or less, more preferably from 500 to 4000 mN/25 mm. The removable pressure sensitive adhesive layer 2b has a shear adhesion thereof is preferably 50000 sec or more, more preferably 70000 sec or more. Particularly, preferred is the removable pressure sensitive adhesive layer 2b having a shear adhesion of 70000 sec in a non-creep (NC) condition.

When the removable pressure sensitive adhesive layer 2b has the above adhesion properties, the removability of the pressure sensitive adhesive double coated sheet at ordinary temperature is enhanced. On this account, when peeling the pressure sensitive adhesive double coated sheet from a hard plate, the operation is performed without difficulty, and further, the residual pressure sensitive adhesive is not stuck on the hard plate so that the number of cleaning the hard plate is reduced.

Examples of the pressure sensitive adhesive having removability and a modulus of elasticity at 120° C. of $5 \times 10^5$ Pa or less may include the following pressure sensitive adhesives essentially comprising non-cross-linked or low cross-linked acrylic copolymers:

(1) non-cross-linked or low cross-linked acrylic copolymers having a high molecular weight,
(2) acrylic copolymers having a narrow molecular weight distribution (particularly, having a small amount of low molecular weight components),
(3) a blend of a non-cross-linked or low cross-linked acrylic copolymer and a cross-linked acrylic copolymer, and
(4) metal cross-linked acrylic copolymers.

The copolymers (1) or (2) have a low proportion of low molecular weight components, so that the shear adhesion of the pressure sensitive adhesive at room temperature is easily increased and the modulus of elasticity thereof at high temperatures can be decreased by non-cross-linking or low-cross-linking. The copolymers can be prepared by a polymerization process that the resulting copolymers have a monomer composition in a partly high concentration, such as emulsion polymerization, suspension polymerization or the like. In these copolymers, the occurrence of internal cross-linking or external cross-linking is depressed, so that the above non-cross-linked or low-cross-linked acrylic copolymers can be prepared.

The pressure sensitive adhesive double coated sheet of the invention is used in the process of preparing semiconductors so that it is preferred to use a nonionic emulsifier in the emulsion polymerization or a nonionic stabilizer in the suspension polymerization. Further, generally speaking, the polymers prepared by these polymerization methods have a ultra-high molecular weight. However, there is a case that the value of molecular weight cannot be determined because the method of measuring molecular weight in this region is not confirmed.

In the above blend (3), the non-cross-linked or low-cross-linked acrylic copolymer components, in low temperature conditions, become incorporated into the cross-linking structure of the cross-linked acrylic copolymer and thereby the shear adhesion of the pressure sensitive adhesive at room temperature can be increased. In high temperature conditions, the non-cross-linked or low-cross-linked acrylic copolymer components cause molecular motion and released from the cross-linking structure to lower the modulus of elasticity of the pressure sensitive adhesive.

The blend of such copolymers can be prepared by crosslinking of a blend of an acrylic copolymer having a functional group relating to cross-linking with an acrylic copolymer free from a functional group relating to cross-linking. This cross-linking may be carried out using an energy radiation polymerizable group as the functional group by irradiation with energy radiation.

The metal cross-linked acrylic copolymers (4) have the bonding strength, which is weakened at high temperatures, and thereby the pressure sensitive adhesives have the above properties.

Further, there is the case of using a pressure sensitive adhesive even if hardly exhibiting removability at ordinary situation, as the removable pressure sensitive adhesive layer 2b of the pressure sensitive adhesive double-coated sheet of the present invention. That is, as long as the pressure sensitive adhesive has removability to work pieces of specific materials, the function thereof as the removable pressure sensitive adhesive can be substantially achieved by using the plate of said materials as the hard plate.

The polymer components used for the pressure sensitive adhesive are particularly not limited, for example, rubbery, acrylic, silicone, polyurethane or polyvinyl ether polymer components.

The thickness of each of the pressure sensitive adhesive layers 2a, 2b, although depending on the properties of the material used therein, is generally in the range of about 3 to 100 µm, preferably about 10 to 50 µm.

The above pressure sensitive adhesive double coated sheet 10 of the present invention is suitably used for the surface protection and wafer fixing during the grinding of the back of semiconductor wafers. Also, when a hard brittle work piece such as a glass/epoxy substrate, a glass or a ceramic is processed (for example, cut), the pressure sensitive adhesive double coated sheet 10 can be employed for temporarily holding the work piece on a hard plate. Examples of suitable hard plates include a glass plate, a quartz plate and plastic plates such as acrylic, polyvinyl chloride, polyethylene terephthalate, polypropylene and polycarbonate plates. The hardness, defined by ASTM D 883, of the hard plate is preferably at least 70 MPa. The thickness of the hard plate, although depending on the properties of the material used therein, is generally in the range of about 0.1 to 10 mm. When ultraviolet light is used as the energy radiation, the hard plate is composed of a material having ultraviolet light-permeability.

The method of using the pressure sensitive adhesive double-coated sheet of the present invention will be described in more detail below with reference to the appended drawings.

Figure 2:
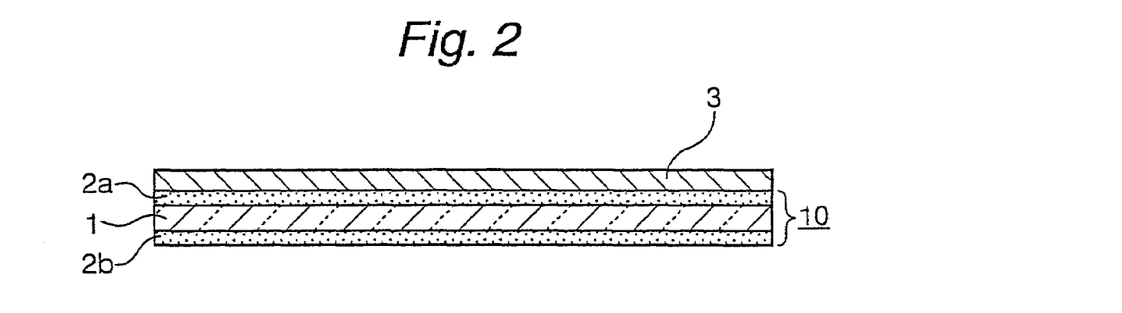
FIG. 2 is a view showing the sticking of a work piece to the pressure sensitive adhesive double coated sheet of the present invention.

Referring first to FIG. 2, work piece 3 is stuck to the energy radiation curable pressure sensitive adhesive layer 2a of the pressure sensitive adhesive double-coated sheet 10. The work piece 3 is, for example, any of the above semiconductor wafer, hard brittle materials such as a glass/epoxy substrate, a glass and a ceramic, and various electronic components and optical parts to be processed, to which, however, the work piece 3 is not limited.

Figure 3:
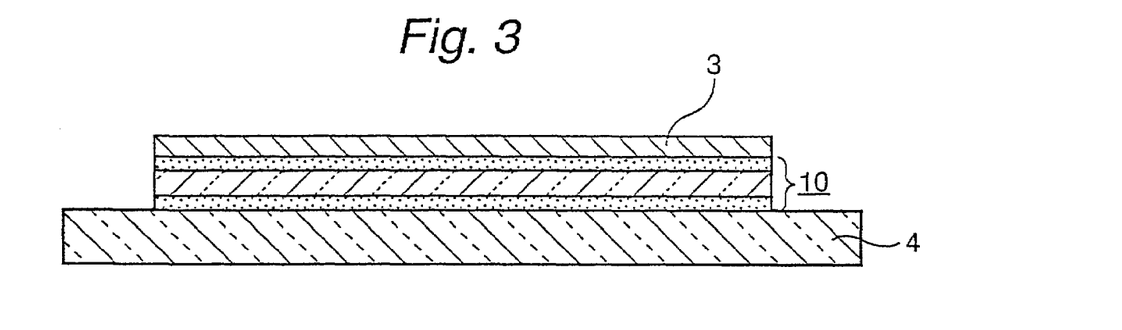
FIG. 3 is a view showing the fixing on a hard plate of the pressure sensitive adhesive double coated sheet having a work piece stuck thereto.

Referring now to FIG. 3, the removable pressure sensitive adhesive layer 2b is stuck to hard plate 4, and the work piece 3 is held on the hard plate 4. Alternatively, the removable pressure sensitive adhesive layer 2b may first be stuck to the hard plate, followed by sticking of the work piece 3 to the energy radiation curable pressure sensitive adhesive layer 2a. In this instance, for preventing the occurrence of bubbles between the removable pressure sensitive adhesive layer 2b and the hard plate 4, it is preferred that the sticking of the removable pressure sensitive adhesive layer 2b to the hard plate 4 be performed in vacuum.

Thereafter, the desired processing of the work piece 3 is performed. For the semiconductor wafer, the processing is, for example, back grinding or dicing into element chips. For the glass/epoxy substrate, the processing is circuit formation or dicing into chips by each circuit. For the glass or ceramic, the processing is, for example, cutting or etching. While the processing is performed, surface protection is simultaneously effected on the side of the work piece 3 brought into contact with the pressure sensitive adhesive layer 2a.

Figure 4:
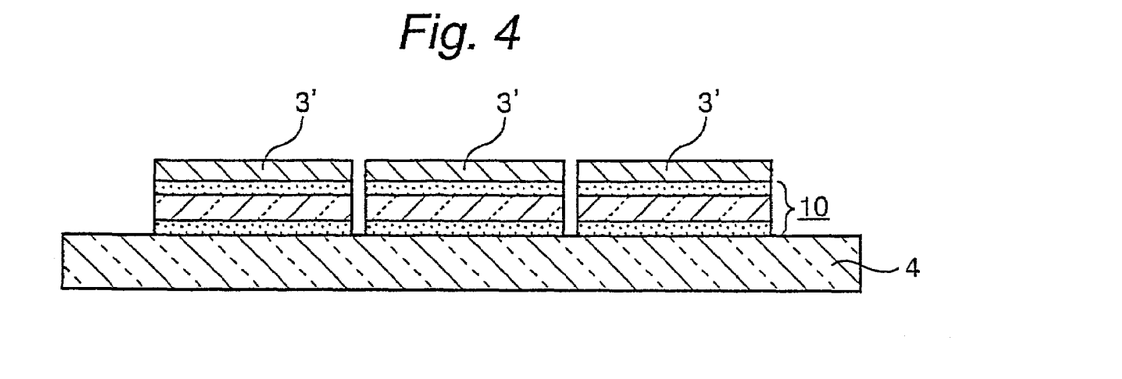
FIG. 4 is a view showing a processed work piece.

FIG. 4 shows, for example, the execution of circuit formation on a semiconductor wafer or a glass/epoxy substrate as the work piece 3 and dicing into chips by each circuit.

Dicing conditions, although not particularly limited, are preferably such that heat shrink substrate 1 is completely cut and divided. This cutting reduces the area of sticking to thereby enable shortening the peeling time. The depth of cut is preferably such that the cut ends at the removable pressure sensitive adhesive layer 2b provided on the hard plate 4 side. The reason is that the hard plate 4 can be reused as many times as desired if no cut is made in the hard plate 4.

Subsequently, not only is the adhesive strength of the energy radiation curable pressure sensitive adhesive layer 2a reduced by irradiating the layer from the hard plate 4 side with energy radiation so as to effect curing but also the shrink substrate 1 is shrunk by appropriate means. For example, if a heat shrink substrate is used, the shrink substrate 1 is shrunk by appropriately heating it. As a result, referring to FIG. 5, shear force generated between the processed work piece 3' and the energy radiation curable pressure sensitive adhesive layer 2a having been cured by the shrinkage of the shrink substrate 1 bring to initiate peeling. The peeling of the processed work piece 3' from the energy radiation curable pressure sensitive adhesive layer 2a having been cured is propagated from the periphery of bonded parts toward the center thereof. Finally, the peeling is effected throughout the bonded parts.

Furthermore, the removable pressure sensitive adhesive layer 2b is also transformed in accordance with the shrinkage of the shrink substrate 1, so that the pressure sensitive adhesive double-coated sheet 10 can be easily removed from the hard plate 4.

Figure 6:
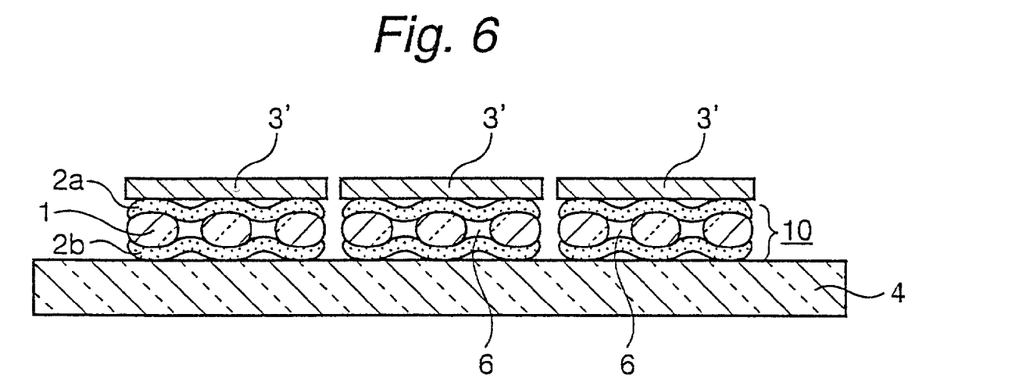
FIG. 6 is a view showing a mode of use of a pressure sensitive adhesive double coated sheet having its substrate furnished with cuts.

As aforementioned, in the pressure sensitive adhesive double-coated sheet of the present invention, the shrink substrate 1 can be furnished with a multiplicity of minute cuts 6. In this instance, when the shrink substrate 1 is shrunk by, for example, heating after desired processing of the work piece 3, the energy radiation curable pressure sensitive adhesive layer 2a is transformed in accordance therewith to thereby reduce the area of contact with the processed work piece 3' with the result that the adhesive strength is reduced (see FIG. 6). Accordingly, the removal of the pressure sensitive adhesive double-coated sheet 10 from the processed work piece 3' can be eased.

The pressure sensitive adhesive double coated sheet 10 of the present invention is especially preferably used in the method of grinding the back of a semiconductor wafer, comprising the following steps.

Figure 7:
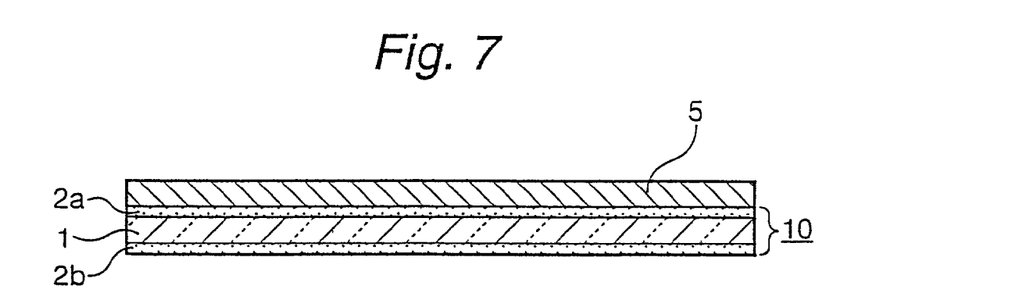
FIG. 7 is a view showing the sticking of a semiconductor wafer to the pressure sensitive adhesive double coated sheet of the present invention.

Referring first to FIG. 7, the circuit surface of semiconductor wafer 5 having its surface furnished with a circuit pattern is stuck to the energy radiation curable pressure sensitive adhesive layer 2a of the pressure sensitive adhesive double coated sheet 10 of the present invention.

Figure 8:
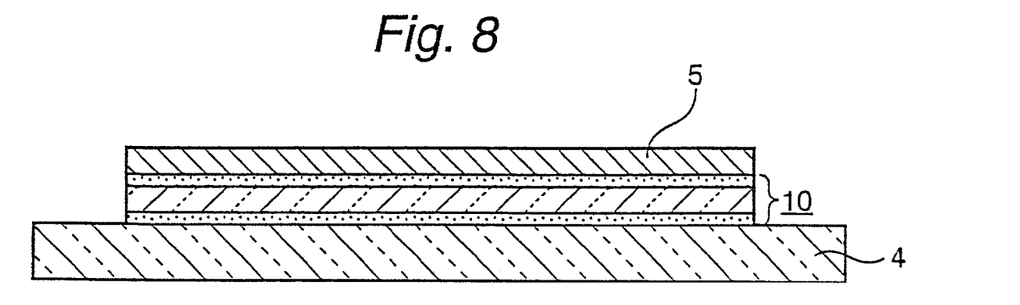
FIG. 8 is a view showing the fixing on a hard plate of the pressure sensitive adhesive double coated sheet having a semiconductor wafer stuck thereto.

Subsequently, referring to FIG. 8, the removable pressure sensitive adhesive layer 2b is stuck to hard plate 4, so that the semiconductor wafer 5 is held on the hard plate 4.

Figure 9:
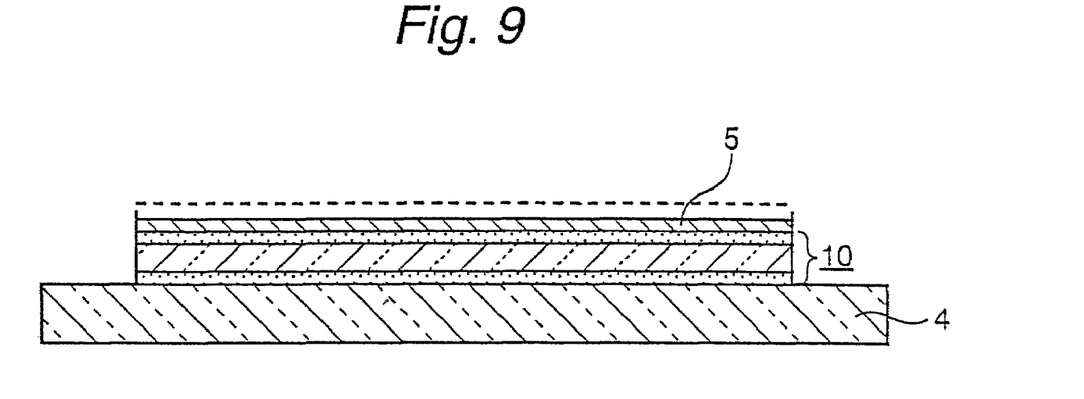
FIG. 9 is a view showing the state of composite after the grinding of the back of a semiconductor wafer.

In the state of being held on the hard plate 4, the semiconductor wafer 5 has its back ground to a desired thickness (see FIG. 9).

Thereafter, the irradiation with energy radiation and shrinkage of shrink substrate are performed in the same manner as mentioned above to thereby enable peeling of the semiconductor wafer 5 from the energy radiation curable pressure sensitive adhesive layer 2a having been irradiated and cured (see FIG. 10).

Alternatively, the wafer dicing as shown in FIG. 4 may be performed after grinding of the back of the semiconductor wafer 5, followed by the irradiation with energy radiation to thereby effect the substrate shrinkage. Thus, the back grinding and dicing can be performed in the same configuration, so that process control can be facilitated. Further, the carrying of wafer between steps can be performed while the wafer is held on the hard plate, so that wafer breakage can be prevented.

Still alternatively, in the present invention, the back of element chips can be ground while the element chips are held on the hard plate after the execution of wafer dicing, contrary to the above.

As is apparent from the foregoing, the above pressure sensitive adhesive double coated sheet of the present invention enables temporarily holding various work pieces to be processed on a hard plate to thereby effect the fixing and protection thereof during processing. Also, the pressure sensitive adhesive double coated sheet of the present invention enables easily peeling the processed work pieces from the sheet by simple operation after the performing of desired processing and protection. Therefore, even if the pressure sensitive adhesive double coated sheet is used in the grinding of the back of, for example, an extremely thin or large-diameter semiconductor wafer, the wafer thickness precision can be enhanced and the warp of the wafer can be reduced thereby. Further, the breakage during wafer carrying can be prevented. Consequently, the pressure sensitive adhesive double coated sheet of the present invention enables production of various electronic components and semiconductor chips with high yield. Moreover, a sequence of steps including processing and carrying can be performed in the same configuration in the present invention, so that the process control can be facilitated.

EXAMPLE

The present invention will further be illustrated below with reference to the following Examples which in no way limit the scope of the invention.

Example 1

1(1) 100 parts by weight of an acrylic pressure sensitive adhesive (copolymer of n-butyl acrylate and acrylic acid), 200 parts by weight of a urethane acrylate oligomer having a molecular weight of 7000, 10 parts by weight of an isocyanate type crosslinking agent (adduct of trimethylolpropane and toluylene diisocyanate, hereinafter referred to as "TM-TDI") and 10 parts by weight of an energy radiation curable reaction initiator (1-hydroxycyclohexyl benzophenone) were mixed together, thereby obtaining a pressure sensitive adhesive composition (the modulus of elasticity thereof at 25° C. after curing with ultraviolet light irradiation was $1.5 \times 10^8$ Pa, and the modulus of elasticity thereof at 120° C. after ultraviolet irradiation was $3.6 \times 10^7$ Pa) as an energy radiation curable pressure sensitive adhesive composition.

1(2) A 25 μm thick polyethylene terephthalate (PET) film having undergone release treatment was coated with the pressure sensitive adhesive composition obtained in the step 1(1) so that the thickness of the coating after drying was 10 μm and heated at 100° C. for 1 min, thereby forming an energy radiation curable pressure sensitive adhesive layer. Thereafter, the energy radiation curable pressure sensitive adhesive layer was stuck to a heat shrink polyethylene film (having a thickness of 35 μm and a shrinkage ratio of 65% at 120° C.), thereby preparing a sheet having one side applied to an energy radiation curable pressure sensitive adhesive layer.

1(3) Further, are movable pressure sensitive adhesive prepared by emulsion polymerization of 99 parts by weight of 2-ethylhexyl acrylate, 0.5 part by weight of acrylic acid and 0.5 part by weight of methacrylic acid using 3 parts by weight of a nonionic emulsifier of nonylphenyl polyoxyethylene ether was mixed with 1.0 part by weight of an epoxy cross-linking agent, thereby obtaining a pressure sensitive adhesive composition (the modulus of elasticity there of at 25° C. was $2.2 \times 10^5$ Pa, and the modulus of elasticity thereof at 120° C. was $8 \times 10^4$ Pa).

1(4) Separately, a 25 μm thick PET film having undergone release treatment was coated with the pressure sensitive adhesive composition obtained in the step 1(3) so that the thickness of the coating after drying was 10 μm and heated at 100° C. for 1 min, thereby forming a removable pressure sensitive adhesive layer.

1(5) The heat shrink polyethylene film side of the pressure sensitive adhesive sheet obtained in the step 1(2), was stuck to the removable pressure sensitive adhesive layer formed on the PET film in the step 1(4), thereby obtaining a pressure sensitive adhesive double coated sheet.

The pressure sensitive adhesive double coated sheet had, on the side of the removable pressure sensitive adhesive layer, an adhesive strength of 520 mN/25 mm (measured using a glass plate which is a hardplate as an adherend in accordance with JIS Z0237) and a shear adhesion of 54000 sec (JIS Z0237)

Example 2

The procedure of Example 1 was repeated except that the pressure sensitive adhesive composition, applied on the removal pressure sensitive adhesive side, was a blend of 100 parts by weight of an acrylic copolymer having a weight-average molecular weight of about 800000 which copolymer comprises 70 parts by weight of n-butyl acrylate and 30 parts by weight of 2-hydroxyethyl acrylate; 50 parts by weight of an oligomer of n-butyl acrylate homopolymer having a weight-average molecular weight of about 3000; and 10 parts by weight of a crosslinking agent (TM-TDI).

The removable pressure sensitive adhesive has a modulus of elasticity at 25° C. of $1.2 \times 10^6$ Pa, and that at 120° C. of $3.8 \times 10^5$ Pa. The pressure sensitive adhesive double coated sheet had, on the side of the removable pressure sensitive adhesive, an adhesive strength of 2200 mN/25 mm and a shear adhesion of 70000 sec.

Example 3

3(1) 100 parts by weight of an acrylic copolymer having a weight-average molecular weight of about 800000 which copolymer comprises 70 parts by weight of n-butyl acrylate and 30 parts by weight of 2-hydroxyethylacrylate, 20 parts by weight of an energy radiation curable acryl polymer obtained by allowing an acrylic copolymer having a weight-average molecular weight of about 800000 which copolymer comprises 70 parts by weight of n-butyl acrylate and 30 parts by weight of 2-hydroxyethylacrylate to react with 80% by equivalent weight of methacryloyloxy ethyl isocyanate, and 1 part by weight of an energy radiation curable reaction initiator (1-hydroxycyclohexyl benzophenone) were mixed together, thereby obtaining a pressure sensitive adhesive composition.

3(2) A 25 µm thick PET film having undergone release treatment was coated with the pressure sensitive adhesive composition obtained in the step 3(1) so that the thickness of the coating was 10 µm and heated at 100° C. for 1 min, and thereafter, the removable pressure sensitive adhesive layer was stuck to a heat shrink polyethylene film (having a thickness of 30 µm and a shrinkage ratio of 40% at 120° C.) Subsequently, ultraviolet light was applied from the side of the heat shrink polyethylene film by high pressure mercury vapor lamp (120 W 2 lights, line speed 5 m/min), and thereby a sheet having one side applied to a removable pressure sensitive adhesive layer (the modulus of elasticity thereof at 25° C. was $7.2 \times 10^6$ Pa, and the modulus of elasticity thereof at 120° C. was $1.8 \times 10^5$ Pa) was prepared.

3(3) A 25 µm thick PET film having undergone release treatment was coated with the energy radiation curable pressure sensitive adhesive composition obtained in the step 1(1) so that the thickness of the coating after drying was 10 µm and heated at 100° C. for 1 min, thereby forming an energy radiation curable pressure sensitive adhesive layer.

3(4) The heat shrink polyethylene film side of the sheet obtained in the step 3(2), was stuck to the energy radiation curable pressure sensitive adhesive layer formed on the PET film in the step 3(3), thereby obtaining a pressure sensitive adhesive double coated sheet.

The pressure sensitive adhesive double coated sheet had, on the removable pressure sensitive adhesive layer side, an adhesive strength of 1500 mN/25 mm and a shear adhesion of 70000 sec/NC.

Comparative Example 1

A pressure sensitive adhesive double coated sheet having its both sides furnished with energy radiation curable pressure sensitive adhesive layers was produced in the same manner as in Example 1 except that the energy radiation curable pressure sensitive adhesive composition prepared in the step 1(1) was used in place of the pressure sensitive adhesive composition of the removable pressure sensitive adhesive.

The pressure sensitive adhesive double coated sheet after cured with ultraviolet light irradiation had an adhesive strength of 120 mN/25 mm and the shear adhesion thereof could not be measured.

Comparative Example 2

The procedure of Example 1 was repeated except that a removable pressure sensitive adhesive (the modulus of elasticity thereof at 25° C. was $1.1 \times 10^6$ Pa, and the modulus of elasticity thereof at 120° C. was $8.0 \times 10^5$ Pa) comprising 100 parts by weight of an acrylic copolymer having a weight-average molecular weight of about 800000 which copolymer comprises 80 parts by weight of n-butyl acrylate and 20 parts by weight of 2-hydroxyethyl acrylate; and 10 parts by weight of a crosslinking agent (TM-TDI) was used as the removable pressure sensitive adhesive composition.

The pressure sensitive adhesive double coated sheet had, on the side of the removable pressure sensitive adhesive layer, an adhesive strength of 2100 mN/25 mm and a shear adhesion of 70000 sec/NC.

The thus obtained pressure sensitive adhesive double coated sheets were evaluated by the following method.

Evaluation Method

An embodiment of the use of pressure sensitive adhesive double coated sheets for the process of grinding wafers, carrying and dicing was conducted in the following manner and then was evaluated.

One side of each of the pressure sensitive adhesive sheets produced in the Examples and Comparative Examples was peeled off the release film and stuck to a circuit side surface of a silicon wafer whose diameter and thickness were 6 inches and 700 µm, respectively. At that time, the energy radiation curable pressure sensitive adhesive layer of each pressure sensitive adhesive double coated sheet was stuck to the silicon wafer.

Subsequently, the other release film was peeled, and the thus exposed pressure sensitive adhesive layer was stuck to a glass plate (200 mm×200 mm×1.15 mm thickness) in vacuum.

After the sticking, the wafers were ground so that the wafers each have a thickness of 100 µm, 50 µm and 30 µm respectively. The ground wafers held in the same state each were carried to a dicing step.

Each thus ground wafer was diced into 10 mm □ or 12 mm □ by means of dicing apparatus AWD-4000B (manufactured by Tokyo Seimitsu Corporation) so that the portion left uncut was 1.16 mm from the bottom face of the glass plate. After the dicing, the glass side was irradiated with ultraviolet light at a luminous energy of 245 mJ/cm$^2$ by means of ultraviolet irradiation apparatus (manufactured by Lintec Corporation Adwill RAD2000 m/8) and each of the samples was placed on a hot plate having its surface heated to 120° C., for 1 minute. Using a suction pen (manufacture by FluoroMechanic Co. ltd., nib: 1.8 mmø), pickup of the chips was carried out by changing the suction pressure from the upper side of the chip and the suction pressure capable of pickup was measured.

The results are given in Table 1.

TABLE 1

| Chip size | Ex. 1 | Ex. 2 | Ex. 3 | Compar. Ex. 1 | Compar. Ex. 2 |
|---|---|---|---|---|---|
| 100 μm thick 10 mm □ | 23 | 35 | 31 | 78 | 98 |
| 100 μm thick 12 mm □ | 32 | 44 | 39 | 92 | 125 |
| 50 μm thick 10 mm □ | 28 | 37 | 31 | 88 | 118 |
| 50 μm thick 12 mm □ | 39 | 42 | 35 | 107 | 128 |
| 30 μm thick 10 mm □ | 35 | 51 | 42 | Chip broken | Chip broken |
| 30 μm thick 12 mm □ | 44 | 62 | 52 | Chip broken | Chip broken |

Unit: kPa

What is claimed is:

1. A pressure sensitive adhesive double coated sheet consisting essentially of a shrink substrate and, superimposed on one side thereof, an energy radiation curable pressure sensitive adhesive layer and, superimposed on the other side thereof, a removable pressure sensitive adhesive layer composed of an adhesive having a modulus of elasticity at 120° C. of 5 ×10$^5$ Pa or less, wherein the shrink substrate is furnished with a multiplicity of minute cuts.

2. The pressure sensitive adhesive double coated sheet as claimed in claim 1, which has, on the side of the removable pressure sensitive adhesive layer, an adhesive strength of 5000 mN/25 mm or less and a shear adhesion of 50000 sec or more.

3. A method of protecting a work piece during processing of the work piece temporarily held on a hard plate, comprising the steps of providing a pressure sensitive adhesive double coated sheet consisting essentially of a shrink substrate and, superimposed on one side thereof, an energy radiation curable pressure sensitive adhesive layer and, superimposed on the other side thereof, a removable pressure sensitive adhesive layer composed of an adhesive having a modulus of elasticity at 120° C. of 5×10$^5$ Pa or less, wherein the pressure sensitive adhesive double coated sheet shrink substrate is furnished with a multiplicity of minute cuts; and adhering the pressure sensitive adhesive double coated sheet to the work piece.

4. The method of claim 3, wherein the pressure sensitive adhesive double coated sheet has on the side of the removable pressure sensitive adhesive layer, an adhesive strength of 5000 mN/25 mm or less and a shear adhesion of 50000 sec or more.

* * * * *

UNITED STATES PATENT AND TRADEMARK OFFICE
CERTIFICATE OF CORRECTION

| | | |
|---|---|---|
| PATENT NO. | : 7,105,226 B2 | Page 1 of 1 |
| APPLICATION NO. | : 10/140355 | |
| DATED | : September 12, 2006 | |
| INVENTOR(S) | : Noguchi et al. | |

It is certified that error appears in the above-identified patent and that said Letters Patent is hereby corrected as shown below:

<u>Title Page</u>, Insert the following (30)   Foreign Application Priority Data
       Aug. 26, 1998  (JP)   ..................... 10-240170
       Apr. 16, 1999  (JP)   ..................... 11-109806

Signed and Sealed this

Ninth Day of January, 2007

JON W. DUDAS
*Director of the United States Patent and Trademark Office*